United States Patent
Colpo et al.

(10) Patent No.: US 6,649,223 B2
(45) Date of Patent: Nov. 18, 2003

(54) METHOD AND APPARATUS FOR INDUCTIVELY COUPLED PLASMA TREATMENT

(75) Inventors: Pascal Colpo, Ispra (IT); François Rossi, Biandronno (IT)

(73) Assignee: European Community (EC), Brussels (BE)

( * ) Notice: Subject to any disclaimer, the term of this patent is extended or adjusted under 35 U.S.C. 154(b) by 0 days.

(21) Appl. No.: 10/203,763

(22) PCT Filed: Feb. 1, 2001

(86) PCT No.: PCT/EP01/01087
§ 371 (c)(1),
(2), (4) Date: Aug. 13, 2002

(87) PCT Pub. No.: WO01/61726
PCT Pub. Date: Aug. 23, 2001

(65) Prior Publication Data
US 2003/0006130 A1 Jan. 9, 2003

(30) Foreign Application Priority Data
Feb. 18, 2000 (EP) .............................. 00400445

(51) Int. Cl.⁷ .................................................. H05H 1/24
(52) U.S. Cl. ................ 427/569; 118/723 VE; 427/237; 427/248.1; 427/294; 427/598
(58) Field of Search ................... 427/569, 598, 427/248.1, 237, 294; 118/723 VE Primary Examiner—Bernard Pianalto
(74) Attorney, Agent, or Firm—Bacon & Thomas, PLLC

(57) ABSTRACT

The apparatus for plasma treatment of a non-conductive hollow substrate (5), comprises a plasma chamber (12) provided with two oppositely facing field admission windows (8, 9), and first and second opposite coil arrangements (20, 30) located on an outer surface (8a; 9a) of the first and second windows respectively. The first and second coil arrangements being connected to power supply means (4) such that a current (I) of a same direction flows simultaneously in the first and second coil arrangements. The two coil arrangements (20, 30) induce through the substrate a magnetic flux (7) transversal and perpendicular to a substrate depth (L) for generating an electrical field in the substrate plan.

17 Claims, 5 Drawing Sheets

METHOD AND APPARATUS FOR INDUCTIVELY COUPLED PLASMA TREATMENT

FIELD OF THE INVENTION

The present invention relates to a method and an apparatus for substrate treatments using plasma such as, for example, plasma assisted processing for antifouling coating depositions, cleaning, sterilization or the like. In particular, the present invention relates to plasma creation for treatment or deposition in hollow substrates having large aspect ratio such as flat boxes, small diameter tubes . . .

BACKGROUND OF THE INVENTION

Hollow substrates with a large aspect ratio are commonly used in various technological fields such as catheters or endoscopes for medical materials and packaging for food or pharmaceutical applications. The expression "large aspect ratio" means that the hollow substrate has at least one dimension that is much larger than another one, and more particularly that the depth of the substrate cavity is much larger than a dimension of the substrate aperture. FIG. 7 shows two examples of hollow substrates which have a large aspect ratio L/a, where L is the depth of the substrate cavity and a is the smallest dimension of the substrate aperture. A tube 30 comprises an inner cavity having a large depth L with respect to the diameter a of the tube. Large aspect ratio substrates may also have a form of a flat box 31 which exhibits a little aperture height a in comparison with its cavity depth L.

In these above applications, plasma treatment or deposition is useful notably for combined cleaning, sterilization and deposition (PECVD) operations for medical materials or barrier coatings and sterilization treatments for food or pharmaceutical packaging. The plasma treatment methods are numerous and various, for example, the surface of a substrate can be modified by plasma treatment in order to increase or decrease its wettability.

In all the case, whatever the result expected (deposition, etching . . . ), the plasma processing is obtained from plasma creation.

A conventional method for creating plasma consists of submitting a process gas containing reactive species to an electric field which ionizes the process gas by accelerating electrons. FIG. 8 shows a classical embodiment allowing capacitive plasma creation in a substrate. A substrate 50 contains a process gas. The substrate is flowed by an electric field 53 created between two electrodes 51 and 52 which are supplied by a power supply 54. However, in the case of a small diameter tube, the plasma cannot be ignited with the electric field perpendicular to the diameter of the tube, because electrons cannot be accelerated up to the ionization potential (the trajectories are stopped by the tube walls). However, even if a suitable configuration can be found, the pressure needed for a capacitive discharge can lead to thermal damages of the substrate walls (case of polymers) and the gas dissociation is limited, which reduces the treatment possibilities. Moreover, the pressure range for a capacitive discharge is limited, which creates problems of control inside the tube itself.

Another traditional method used in plasma treatment inside a hollow substrate is the diffusion of active species created outside. As can be seen on FIG. 9, an external plasma source 40 creates active species diffused inside the hollow parts of a substrate 41 having a cavity length L and a thickness or diameter a. However, such a diffusion results in a non uniformity of the treatment or deposition process along the substrate because of consumption of active species during diffusion. In other words, in using an external plasma source for treatment inside the hollow parts of a substrate, the plasma diffusion density is decreased along the substrate length L.

Alternatively, a method for plasma treatment can be based on inductively coupled plasma. As illustrated in FIG. 10, the plasma is created inside a substrate 61 with a classical tangential electromagnetic flux generated by a current flowing in a coil 60 in the direction of an arrow 63. In flowing in the coil 60, the current produces a magnetic field 64 which generates an electric field 62 inside the substrate. The plasma production is realized from a process gas contained inside the substrate and by acceleration of the electrons along the electric field 62 tangential to the substrate.

FIG. 11 shows a matched embodiment for implementing the inductively coupled plasma method inside a tube 71. In this embodiment, a coil 70 surrounds the tube 71 and carries a current in a direction of an arrow 72 so as to produce a magnetic field 74 which generate an electric field 73. The plasma is thus created in the tube by accelerating the electrons according to the direction of the electric field 73.

However, the efficiency of such configurations depends on a ratio R between the diameter or thickness a of the hollow substrate and the plasma skin depth $$\delta : R = \frac{a}{\delta},$$

where the plasma skin depth $\delta$ is determined by the process parameters, that is to say plasma density, gas nature and pressure, power, electron temperature, which are inherent to the required treatment or deposition. In this configuration, to obtain a suitable efficiency, the ratio R must be greater than 2 or 3. Accordingly, this criterion excludes such a process for low thickness or diameter hollow substrate, in particular when the thickness or diameter is lower than the plasma skin depth ($a < \delta$).

OBJECT AND SUMMARY OF THE INVENTION

In view of such aspects, an object of the present invention is to provide a method and an apparatus in which the above-mentioned problems can be solved. In other words, an object is to provide a method and an apparatus which allow a plasma treatment of hollow substrates in uniform way all-over the inside parts of the substrates.

To this end, there is provided a method for plasma treatment of a hollow substrate made of a non-conductive material in which a plasma is generated from a process gas inside the substrate, characterised in that the plasma generation comprises the step of producing through the substrate a magnetic field substantially perpendicular to a direction of a substrate depth L.

Thus according to the present invention, all the inside parts of a thin hollow substrate may be plasma treated uniformly with a great efficiency and with a high flexibility in pressure adjustment. Indeed, the simplest description of the inductive coupling between an induction source and a plasma is a circuit model in which the induction source is the primary winding of a transformer and the plasma the secondary winding. The plasma is represented by an inductance and a resistance, as a function of parameters such as power, gas pressure, plasma density . . . . In this model, the current induced in the plasma flows within a skin depth δ given by the following equation (1):

$$\delta = \left(\frac{2}{\mu\omega\sigma}\right)^{\frac{1}{2}},$$

where $\mu$ is the permeability of the medium, $\omega$ the excitation frequency and $\sigma$ the plasma electrical conductivity. The electrical conductivity $\sigma$ is directly proportional to the plasma density and can be written according to the equation $$\sigma = \frac{ne^2}{m_e(\upsilon + j\omega)},$$

where n is the plasma density, e and $m_e$ the electronic charge and mass respectively and $\upsilon$ the electron collision frequency.

According to Maxwell equation, the current in the plasma decreases in the skin depth δ as $$\frac{1}{e}.$$

As the current decreases in proportion as it penetrates into the plasma, the skin depth δ is thus an important parameter in plasma treatment or deposition because the value δ determines the proportion according to which the current will decrease.

The efficiency of the plasma treatment versus a ratio $$R = \frac{a}{\delta}$$

for a classical tangential flux exhibits that for a given plasma skin depth δ (plasma conductivity, density . . . ), the suitable efficiency is obtained with R=3. Accordingly, referring to equation (1), for a thin plasma thickness a, it is necessary to increase the excitation frequency ω to decrease δ in order to have an optimum coupling efficiency.

The typical operating frequency delivered by the power supply devices commonly used is 13.56 MHz. Increasing the excitation frequency will require to develop or use expensive further power supply devices which are not suitable for the applications thought in the present invention.

The solution proposed by the present invention is to produce a magnetic flux which flows through a non-conductive hollow substrate in a direction perpendicular to the substrate depth. Accordingly, the magnetic flux creates an electric field in the whole substrate which ionizes the gas in the whole substrate volume resulting in a uniform plasma treatment of the inside parts of the substrate. For given plasma conditions (similar to those assumed for the classical tangential flux), the efficiency of the plasma treatment versus the ratio $$R = \frac{a}{\delta}$$

exhibits greater values for small plasma thickness (R≈0.3) and therefore is suitable for plasma treatment or deposition in thin hollow substrates. In this case, the increase of the excitation frequency ω is not required for reaching the optimum efficiency for thin hollow substrate treatment.

Preferably, the magnetic field is created by means of first and second opposite coil arrangements carrying a current of a same direction.

A magnetic flux is uniformly produced through the substrate by means of two opposite coil arrangements which sandwiches the substrate.

According to an aspect of the invention, the process gas comprises reactive species.

In this case, the plasma treatment correspond to a diffusion of reactive species inside the substrate so as to react with the substrate and remove material therefrom.

According to another aspect of the invention, the process gas comprises material elements to be deposited.

The method is used for material deposition on the parts of the substrate.

However, the process gas may contains both reactive species and material elements to be deposited resulting in a combined effect of the plasma treatment.

Advantageously, the method may further comprises the step of setting a pressure inside the substrate independently of a pressure adjusted outside of the substrate.

By setting the pressure of the process gas independently inside and outside of the substrate, the plasma treatment can be achieved independently inside and outside of the substrate, at different rates or with selectivity during the same operation.

Typically, the current (I) is delivered at a frequency around 10 kHz to 100 MHz, preferably at a frequency of 13.56 MHz.

The perpendicular magnetic flux allows the coils arrangements to be supplied with common power supply frequencies while keeping an optimum efficiency of the thin hollow substrate plasma treatment.

Advantageously, the first and second coil arrangements comprise a magnetic core.

The magnetic flux can be enhanced by use of a magnetic pole in addition to the coil arrangements.

According to an aspect of the invention, the substrate is a hollow substrate with a large aspect ratio (L/a).

As the good efficiency criterion for perpendicular magnetic flux is R≈0.3, the method according to the invention is suitable for plasma treatment of the parts of hollow substrates which exhibits small aperture height with respect to the depth of their cavity.

More particularly, the depth (L) is the largest dimension of the substrate.

The present invention also provides an apparatus for plasma treatment of a non-conductive hollow substrate, comprising generation means for generating a plasma in the substrate, characterised in that the generation means comprise electromagnetic means for producing through the substrate a magnetic flux perpendicular to a direction of a substrate depth (L).

Accordingly, the apparatus produces a magnetic flux through the substrate with generation means in such a way that the magnetic flux is perpendicular all along the direction of the substrate depth.

More specifically, the generation means comprise a plasma chamber provided with two oppositely facing field admission windows and, as electromagnetic means, first and second opposite coil arrangements located on an outer surface of the first and second windows respectively, the first and second coil arrangements being connected to power supply means such that a current (I) of a same direction flows simultaneously in the first and second coil arrangements.

Thus, a hollow substrate may be entirely plasma treated in the apparatus by means of a plasma chamber which allows a process gas to be maintained inside and outside the parts of the substrate and by means of the coils arrangements which produce a magnetic flux creating an electric field in the whole volume of the chamber.

According to an aspect of the invention, the substrate is an hollow substrate with a large aspect ratio (L/a). The depth (L) is the largest dimension of the substrate.

According to an embodiment of the invention, the first and second coil arrangements comprises each an inductor having a serpentine form.

Such a configuration of the coil arrangement is advantageous for producing a magnetic flux perpendicular to the substrate in the entire spaced defined between the coil arrangements.

According to another embodiment of the invention, the first and second coil arrangements comprise each an inductor having a superimposed serpentine form.

This configuration is advantageous for increasing the power of the electromagnetic energy produced by the coil arrangements.

Advantageously, the first and second coil arrangements further comprise a magnetic core associated with the inductors of said coil arrangements, the magnetic core presenting a unipolar pole face structure adapted to be applied against or close to the filed admission windows.

Hence, the magnetic flux can be enhanced by use of a magnetic pole in addition to the coil arrangements.

Typically, the power supply means deliver power at a frequency around 10 kHz to 100 MHz, preferably at a frequency of 13.56 MHz.

BRIEF DESCRIPTION OF THE DRAWINGS

The invention and its advantages will be better understood from the following description, given as non-limiting examples, of preferred embodiments with reference to the appended drawings, in which.

DESCRIPTION OF THE PREFERRED EMBODIMENTS

Figure 5:
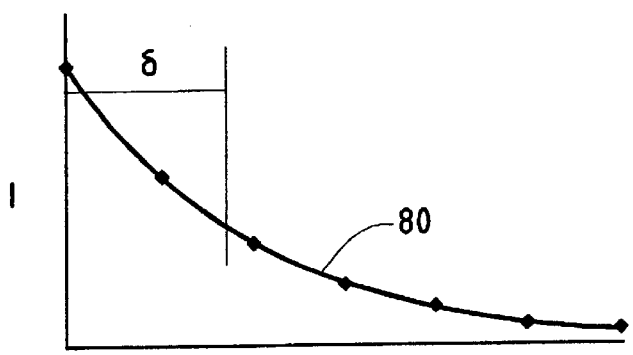
FIG. 5 is a diagram showing a current value in a plasma skin depth.

FIG. 5 shows how a current 80 decreases in proportion as it penetrates into the plasma. The skin depth δ is thus an important parameter in plasma treatment or deposition because the value δ determines the proportion according to which the current will decrease.

Moreover, the electrical power P conveyed through an infinite slab which is subjected to a uniform field is given by the following equation (3).

$$P = \frac{B}{2\mu} \frac{\rho}{\delta} T,$$

where B is the magnetic induction, ρ the resistivity of the conductor medium, μ the permeability of the medium, δ the electromagnetic skin depth, and T the power transmission coefficient.

According to equation (3), the electrical power P critically depends on the power transmission coefficient T which varies as a function of the ratio $$R = \frac{a}{\delta}.$$

Figure 6:
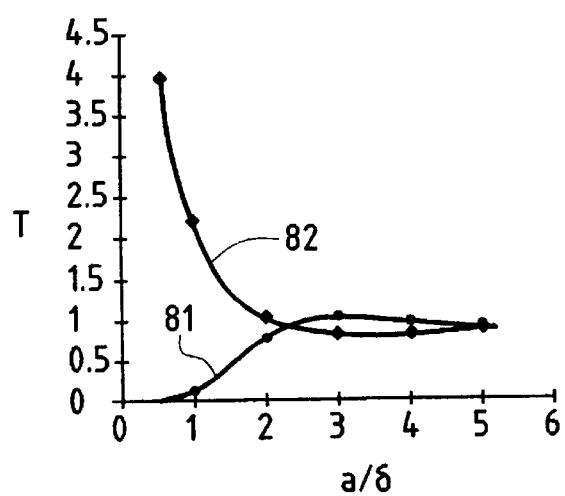
FIG. 6 is a diagram showing the efficiency of plasma treatment versus a ratio R when a tangential electromagnetic flux is generated and when a perpendicular electromagnetic flux is generated.
Figure 10:
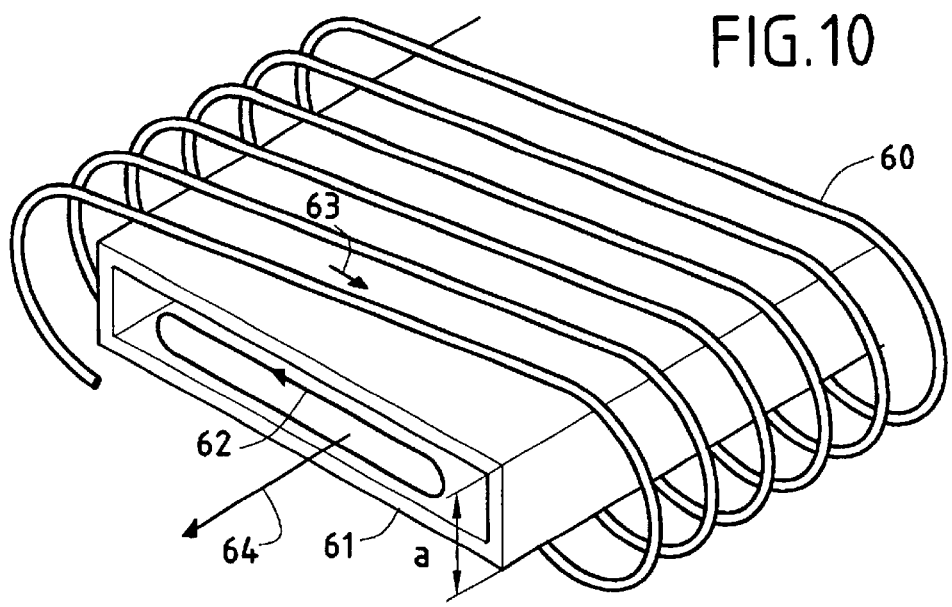
FIG. 10 is a schematic perspective view showing a third conventional plasma substrate treatment according to a first aspect.
Figure 11:
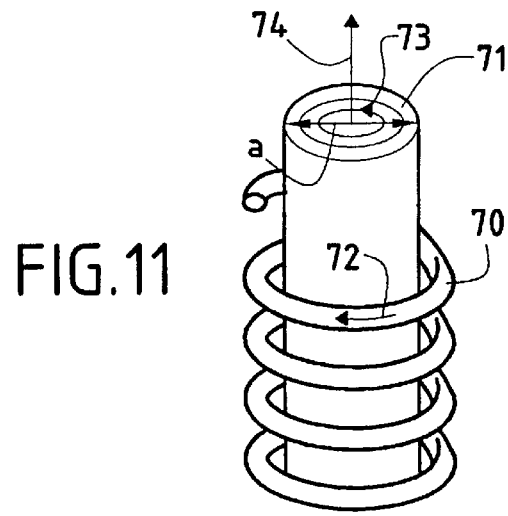
FIG. 11 is a schematic perspective view showing a third conventional plasma substrate treatment according to a second aspect.

FIG. 6 illustrates a power transmission coefficient T curve 81 versus the ratio $$R = \frac{a}{\delta}$$

for a classical tangential flux already described in relation with FIGS. 10 and 11. The curve 81 shows that for a given plasma skin depth δ (plasma conductivity, density . . . ) the suitable efficiency is obtained with R=3. On such a basis, in order to treat thin hollow substrates (i.e. a<δ), a solution could consist of increasing the excitation frequency ω in order to decrease the skin depth δ. However, the typical operating frequency delivered by the power supply devices commonly used is 13.56 MHz. Increasing the excitation frequency will require to develop or use expensive further power supply devices which are not suitable for the applications thought in the present invention. Moreover, the path formed in the substrate plan for accelerating the electrons can be too short for allowing an efficient ionization of the process gas. In a tube shape substrate, for example, the tangential accelerating electron path created by the tangential electric field is not long enough to allow a sufficient ionization of a process gas.

FIG. 6 also shows the power transmission coefficient T curve 82 obtained with a perpendicular magnetic flux supplied by the apparatus according to the present invention. For given plasma conditions, the efficiency curve 82 exhibits greater values when the ratio R has a value around 0.3. Such a configuration is therefore suitable for plasma treatment or deposition in thin hollow substrates. In this case, the increase of the excitation frequency ω is not required for reaching the optimum efficiency for thin hollow substrate treatment.

Figure 1:
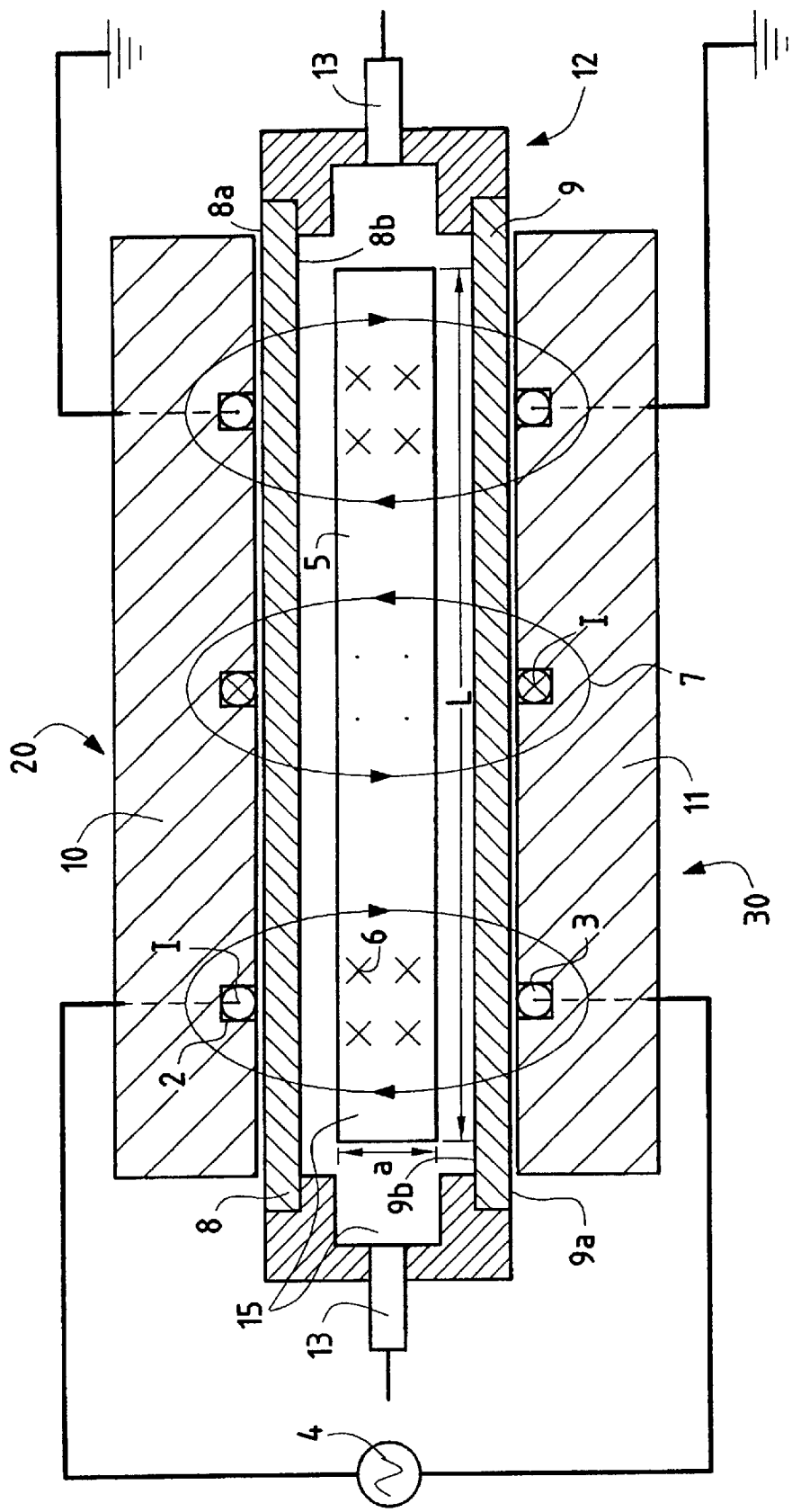
FIG. 1 is a schematic cross-sectional view of an apparatus for plasma treatment according to an embodiment of the invention.

The method and apparatus to produce a transversal magnetic flux according to the present invention will be described in relation with FIG. 1. The apparatus comprises a classical plasma chamber configuration 12 in which a plasma processing can be implemented. The chamber 12 includes a sealed area which can be evacuated by means of a pumping device connected to a gas outlet port 13. The chamber is filled with a process gas 15 via an inlet port 14. According to its composition, the process gas 15 in response to an electromagnetic energy will react by creating a plasma for diffusion, treatment process or both. As the substrate is included in the sealed area of the chamber 12, the process gas can be ionized inside and/or outside the substrate allowing plasma creation inside and/or outside the substrate.

The gas outlet port 13 is also used to set the pressure of the process gas 15 in the chamber. The plasma chamber further comprises a first and a second field admission windows 8, 9 made of quartz or other dielectric material such as to allow an energy field to enter inside the chamber by inductive coupling and thereby create or sustain the required plasma processing conditions. The space defined between the two windows substantially corresponds to the thickness dimension of the plasma chamber volume occupied by a hollow substrate 5 of a diameter or a smallest aperture dimension a and a cavity depth L. The form and the dimensions of the plasma chamber and so the field admission windows depend on the form and the size of the substrate to be treated. For example, the field admission windows have to cover at least the whole widest face of a parallelepipedic hollow substrate or the cylindrical part of a tubular substrate.

In order to produce a transversal magnetic flux 7 which is substantially perpendicular to a substrate cavity depth L, two coil arrangements 20, 30 are disposed close to the external surfaces 8a, 9a of the windows 8, 9 in such a manner that each coil arrangement faces a corresponding window. The coil arrangements both supply by a same AC power supply source 4 which generates an electrical current I flowing in the same direction in both inductors 2 and 3 of the coil arrangements 20, 30, respectively. The inductors 2 and 3 of the coils arrangements 20 and 30 may also be independently supplied from two separate AC power sources provided that the current in both inductors flows simultaneously in the same direction in order to prevent a magnetic flux induced from an inductor to be canceled by the magnetic flux induced from the other.

Accordingly, the magnetic flux 7 is produced transversally and perpendicularly to the substrate 5 in a sense determined by the direction of the current flowing in the coils arrangements. As the substrate 5 is non-conductive, the magnetic flux 7 generates an electric field 6 which is produced in the substrate plan perpendicularly to the direction of the magnetic flux 7.

Figure 2:
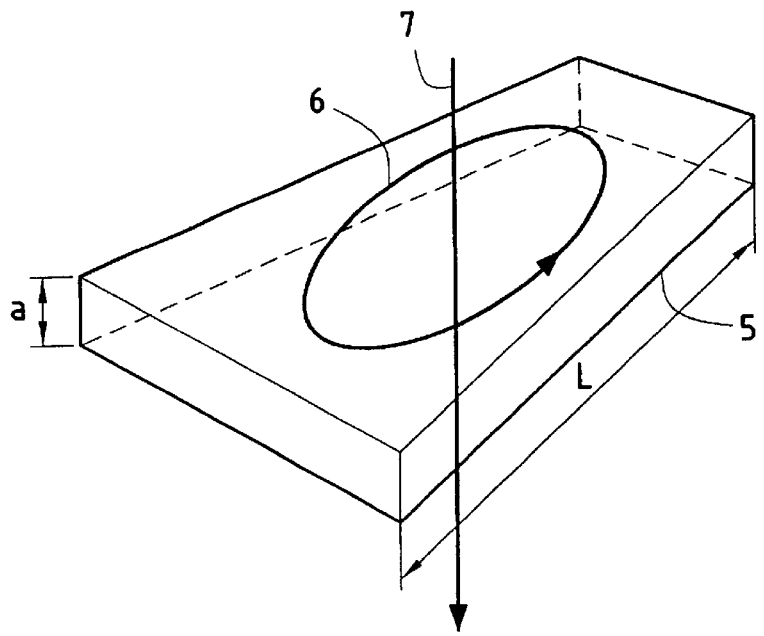
FIG. 2 is a perspective view showing the electromagnetic flux created in a substrate plan according to the invention.

Referring to FIG. 2, as the magnetic flux 7 is perpendicular and transverse to the cavity depth of the substrate 5, the electric field 6 circles in a loop all over the substrate plan. Accordingly, the path for accelerating the electrons is longer and an efficient plasma creation can therefore be obtained without high temperature generation which can damage the substrate.

As a result, the electrical flux is created in the whole chamber area which ionizes the process gas in the whole substrate volume. This configuration is particularly suitable for plasma treatment of thin hollow substrates since the good efficiency criterion for transversal flux determined from curve 82 of FIG. 6 is R≈0.3. The coil arrangements may be driven by the power supply 4 at a frequency of around 10 kHz to 100 MHz. For example, the typical operating frequency of 13.56 MHz, delivered by the power supply devices commonly used, is sufficient to treat numerous types of thin hollow substrates with an optimum efficiency.

Moreover, the propagation of the magnetic field is independent of the substrate parts placed in the chamber, since they are non conductive. This point is particularly important for the treatment of the internal substrate parts because the plasma production by electric field alone is not possible in that case.

Figure 3:
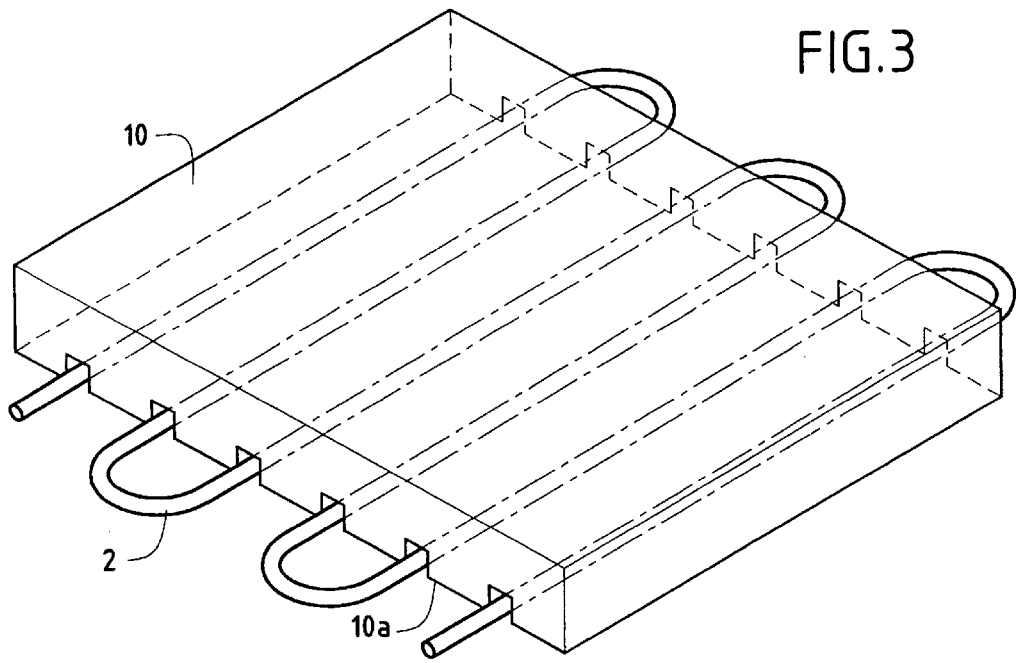
FIG. 3 is schematic perspective view of a coil arrangement according to a first embodiment of the invention.

A first embodiment of one of the two coil arrangements 20 or 30, which are similar, is illustrated in FIG. 3. The arrangement comprises an inductor 2 disposed according to a serpentine form in such a way that the inductor presents a series of opened linked loops.

Figure 4:
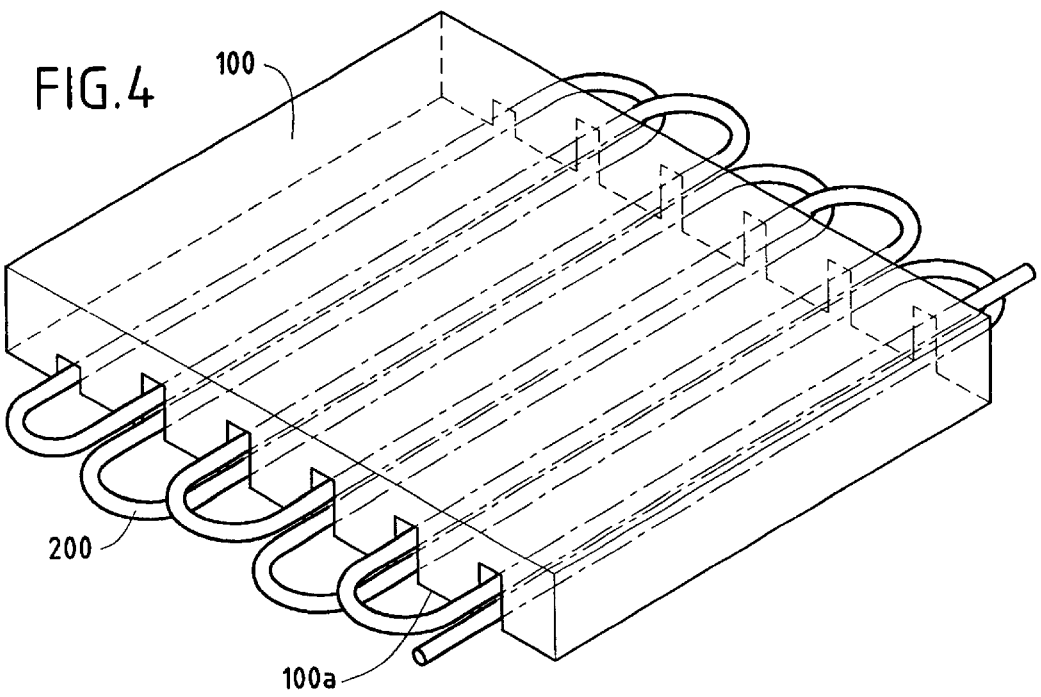
FIG. 4 is schematic perspective view of a coil arrangement according to a second embodiment of the invention.
Figure 7:
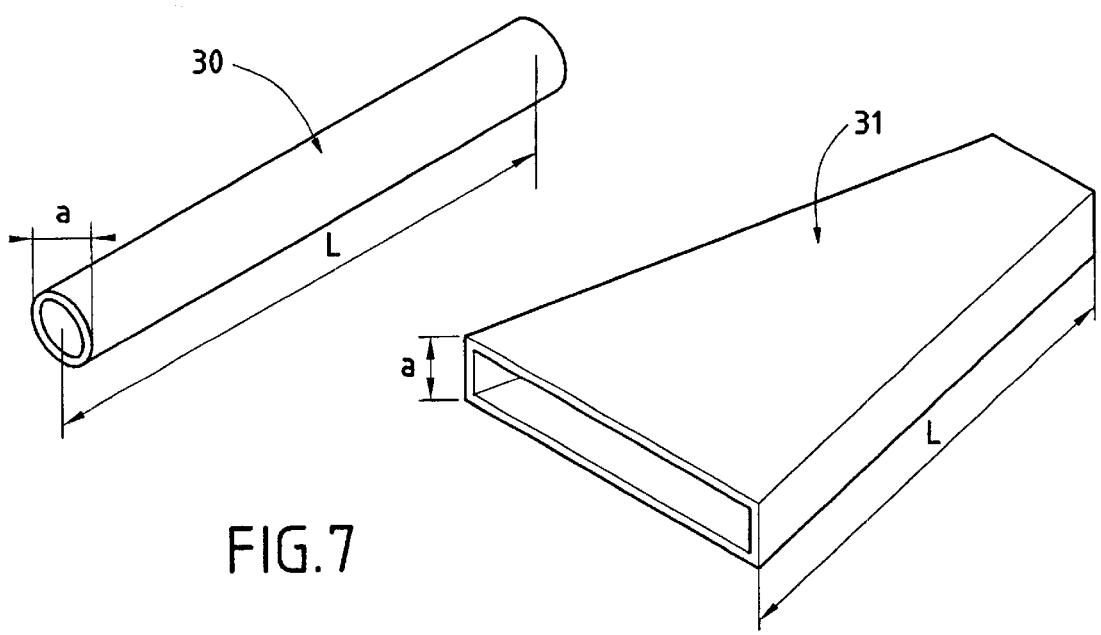
FIG. 7 is a perspective view of two substrates examples.
Figure 8:
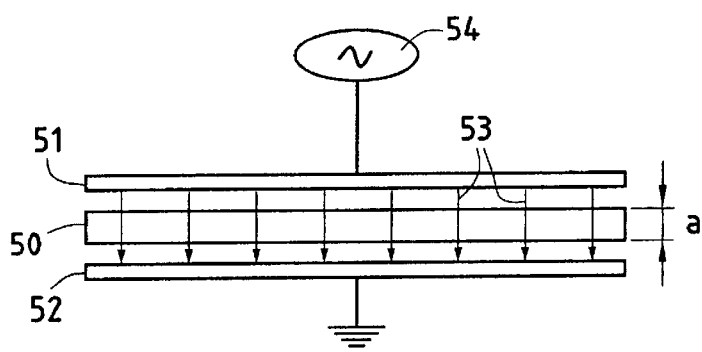
FIG. 8 is a schematic cross-sectional view of a first conventional plasma substrate treatment.
Figure 9:
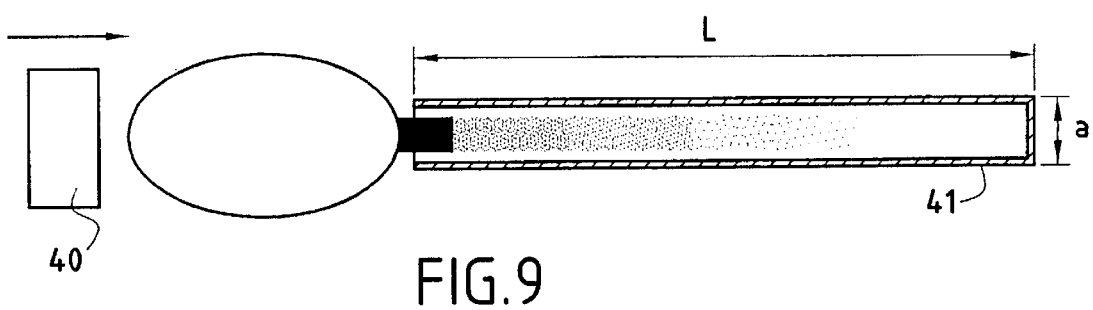
FIG. 9 is a schematic cross-sectional view of a second conventional plasma substrate treatment.

FIG. 4 shows a second embodiment of one of the two coil arrangements 20 or 30. In this configuration, the arrangement comprises a series of superimposed linked loops formed by a single inductor 200. Such an arrangement allows the inductive energy produced by the inductor to be increased.

The coil arrangements in the present invention are not limited to the two above examples and a man skilled in the art could obviously imagine various embodiments for the coil arrangement without any difficulties.

The loops extends in series parallel to the substrate depth direction, in other words the series of loops extends substantially all along the depth of substrate cavity. Each loop is comprised of two substantially parallel straight portions connected to each other by a curved portion. The two straight portions are substantially perpendicular to the direction of the substrate depth L. The size of the loops is determined so as to extend all over a surface of the substrate in a direction perpendicular to the substrate cavity depth. In the case of a tubular substrate, as the loops extends along the substrate cavity depth L of the substrate, the loops need to have a size of at least the diameter a of the substrate. The size of the windows has to be obviously adapted to the size defined for the coil arrangements.

The inductor may be associated with a magnetic core in order to increase and homogenize the magnetic field produced by the inductor. This technical aspect of such an association as also its various embodiments have already been described in detail in European Patent Application EP 0 908 923. Referring to FIGS. 3 and 4, the magnetic core 10, 100 includes a unipolar pole face structure 10a, 100a to ensures that the magnetic field minimizes the "dead area" at the intervals between the loops formed by the inductor. Accordingly, the combination of the magnetic core and the inductor form a coil arrangement which allows an homogenized magnetic flux all over the substrate and notably in the edge parts of the substrate. Referring to FIGS. 3 and 4 again, the inductors 2, 200 are comprised in a lower part of the magnetic cores 10, 100 respectively so as to be close to the field admission window of the plasma chamber. However, according to the nature of the material constituted the magnetic core or the magnetic flux expected, the inductor may be located at different positions in the magnetic core. The magnetic core may be easily matched to the shape and dimensions of the field admission windows.

What is claimed is:

1. Method for plasma treatment of a hollow substrate (5) made of a non-conductive material in which a plasma is generated from a process gas (15) inside the substrate, said plasma generation comprising the step of producing through the substrate a magnetic field (7) substantially perpendicular to a direction of a substrate depth (L).

2. Method according to claim 1, wherein said magnetic field is created by means of first and second opposite coil arrangements (20, 30) carrying a current (I) of a same direction.

3. Method for plasma treatment according to claim 1, wherein said process gas comprises reactive species.

4. Method for plasma treatment according to claim 1, wherein said process gas comprises material elements to be deposited.

5. Method for plasma treatment according to claim 1, wherein it further comprises the step of setting a pressure inside the substrate independently of a pressure adjusted outside of the substrate.

6. Method for plasma treatment according to claim 1, wherein said current (I) is delivered at a frequency around 10 kHz to 100 MHz, preferably at a frequency of 13.56 MHz.

7. Method for plasma treatment according to claim 1, wherein said first and second coil arrangements (20, 30) comprise a magnetic core (10; 100).

8. Method for plasma treatment according to claim 1, wherein the substrate is a hollow substrate with a large aspect ratio (L/a).

9. Method for plasma treatment according to claim 1, wherein said depth (L) is the largest dimension of the substrate.

10. Apparatus for plasma treatment of a non-conductive hollow substrate (5), comprising generation means for generating a plasma in the substrate, said generation means comprises electromagnetic means (20, 30) for producing through the substrate a magnetic flux (7) perpendicular to a direction of a substrate depth (L).

11. Apparatus according to claim 10, wherein said generating means (20, 30) comprises a plasma chamber (12) provided with two oppositely facing field admission windows (8, 9) and, as electromagnetic means (20, 30), first and second opposite coil arrangements located on an outer surface (8a; 9a) of the first and second windows respectively, the first and second coil arrangements being connected to power supply means (4) such that a current (I) of a same direction flows simultaneously in the first and second coil arrangements.

12. Apparatus according to claims 10, wherein the substrate is an hollow substrate with a large aspect ratio (L/a).

13. Method for plasma treatment according to claim 10, wherein said depth (L) is the largest dimension of the substrate.

14. Apparatus according to claim 10, wherein said first and second coil arrangements comprises each an inductor (2, 3) having a serpentine form.

15. Apparatus according to claim 10, wherein said first and second coil arrangements each comprises an inductor (200) having a superimposed serpentine form.

16. Apparatus according to claim 10, wherein said first and second coil arrangements further comprise a magnetic core (10; 100) associated with the inductors of said coil arrangements, the magnetic core presenting a unipolar pole face structure adapted to be applied against or close to the filed admission windows.

17. Apparatus according to claim 10, wherein said power supply means (4) deliver power at a frequency around 10 kHz to 100 MHz, preferably at a frequency of 13.56 MHz.

* * * * *